United States Patent [19]
Atalar et al.

[11] Patent Number: 6,031,375
[45] Date of Patent: Feb. 29, 2000

[54] METHOD OF MAGNETIC RESONANCE ANALYSIS EMPLOYING CYLINDRICAL COORDINATES AND AN ASSOCIATED APPARATUS

[75] Inventors: Ergin Atalar, Columbia, Md.; Ogan Ocali, Santa Clara, Calif.

[73] Assignee: The Johns Hopkins University, Baltimore, Md.

[21] Appl. No.: 08/979,121

[22] Filed: Nov. 26, 1996

[51] Int. Cl.[7] .................................................. G01V 3/00
[52] U.S. Cl. ............................................ 324/307; 600/410
[58] Field of Search ..................................... 324/307, 309, 324/306, 312, 314, 318, 322; 600/410, 420, 421, 423

[56] References Cited

U.S. PATENT DOCUMENTS

| | | |
|---|---|---|
| 4,766,381 | 8/1988 | Conturo et al. . |
| 5,099,208 | 3/1992 | Fitzpatrick et al. . |
| 5,352,979 | 10/1994 | Conturo . |
| 5,447,156 | 9/1995 | Dumoulin et al. ............ 128/653.2 |
| 5,512,825 | 4/1996 | Atalar et al. . |
| 5,715,822 | 2/1998 | Watkins et al. ............ 128/653.5 |

OTHER PUBLICATIONS

D.I.Hoult, "Rotating Frame Zeugmatography", *Phil. Trans. R. Soc. Lond.*, (1980), B289, pp. 543–547, Great Britain.

M. Garwood et al., "Magnetic Resonance Imaging With Adiabatic Pulses Using a Single Surface Coil for RF Transmission and Signal Dectection", *Magnetic Resonance In Medicine*, (1989), 9, pp. 25–34, USA.

*Primary Examiner*—Louis Arana
*Attorney, Agent, or Firm*—Greenberg Traurig; Mark A. Wurm

[57] ABSTRACT

A method of magnetic resonance imaging employs cylindrical coordinates and in one embodiment has an elongated catheter which is operatively associated with an RF pulse transmitting antenna and an RF pulse transmitting body coil. A main magnetic field is imposed on the region of interest. Circumferential phase encoding is accomplished by applying an initial RF pulse from either the catheter antenna or the body coil and subsequently applying an initial series of RF pulses with the source alternating between the antenna and the body coil. Radial phase encoding is effected by applying a first RF pulse which in a second embodiment is followed by a second RF pulse. A longitudinal gradient magnetic pulse is applied in the region of interest to spatially encode magnetic resonance signals. The cylindrical coordinate imaging is obtained by combining the circumferential phase encoding information the longitudinal magnetic encoding information with or without the radial phase encoding information. Other embodiments not employing catheter antennas employ two antennas with non-uniform phase profiles with the pulse sequences employed with the antennas. Corresponding apparatus is provided.

52 Claims, 11 Drawing Sheets

METHOD OF MAGNETIC RESONANCE ANALYSIS EMPLOYING CYLINDRICAL COORDINATES AND AN ASSOCIATED APPARATUS

BACKGROUND OF THE INVENTION

1. Field of the Invention

The present invention relates to a method of magnetic resonance analysis employing cylindrical coordinates and a catheter antenna and related apparatus and, more specifically, it relates to such magnetic resonance imaging wherein alternating use of the catheter antenna and the body coil means as the source of the RF pulses facilitates obtaining high resolution images.

2. Description of the Prior Art

The advantageous use of non-invasive and non-destructive test procedures has long been known in both medicine and industrial applications. In respect of medical uses wherein it is desirable to limit a patient's exposure to potentially damaging x-ray radiation, it has been known to accomplish imaging objectives through the use of other non-invasive imaging procedures, such as, for example, ultrasound imaging and magnetic resonance imaging. See, for example, U.S. Pat. Nos. 4,766,381; 5,099,208; 5,352,979; and 5,512,825.

In a general sense, magnetic resonance imaging involves providing bursts of radio frequency (RF) energy to a region of interest of a specimen positioned in a main magnetic field in order to induce responsive emission of magnetic radiation from the hydrogen nuclei or other nuclei. The emitted signal may be detected in such a manner as to provide information as to the intensity of the response and the spatial origin of the nuclei emitting the responsive magnetic signal. In general, the imaging may be performed in a slice or plane, or multiple planes, or three-dimensional volume with information corresponding to the responsively emitted magnetic radiation being delivered to a computer which stores the information in the form of numbers corresponding to the intensity of the signal. The computer may establish a pixel value as by employing Fourier Transformations which convert the signal amplitude as a function of time to signal amplitude as a function of frequency. The signals may be stored in the computer and may be delivered with or without enhancement to a video screen display, such as a cathode-ray tube, for example, wherein the image created by the computer output will be presented through regions of contrasting black and white which vary in intensity or color presentations which vary in hue and intensity.

Obtaining ultra-high resolution in existing systems has been difficult. With conventional methods, microscopic or near-microscopic resolution can be achieved using high strength gradients with very short rise times. However, these gradients are very expensive and the nerve stimulation threshold imposes restrictions on maximum gradient strength.

SUMMARY OF THE INVENTION

The present invention has satisfied the above-described needs. In the present invention a high resolution is obtained without requiring the use of high strength gradients. This is accomplished through the use of unique cylindrical encoding methods and the associated apparatus.

The invention includes the use of a support member, a catheter antenna and an operatively associated body coil. In one embodiment wherein imaging of the blood vessels, such as in an investigation of atherosclerotic plaques is employed a catheter antenna and body coil are operatively associated with a catheter.

The method of the invention in one embodiment includes effecting magnetic resonance imaging employing cylindrical coordinates as distinguished from Cartesian coordinate systems. A main magnetic field is imposed in alignment with the catheter antenna on the region of interest of a specimen. Circumferential phase encoding is effected by applying to the region of interest an initial RF pulse from the catheter antenna or the body coil means and subsequently applying an initial series of RF pulses alternating between the catheter antenna and the body coil means as the source of the RF pulses. Radial phase encoding is effected by applying a first RF pulse from the catheter antenna. A longitudinal gradient magnetic pulse is applied to the region of interest to spatially encode magnetic resonance signals. In one embodiment, the cylindrical coordinate image is obtained by combining the information obtained from the circumferential phase encoding step and the longitudinal frequency encoding step. In another, information obtained from a radial phase encoding step is combined with the information obtained from the circumferential and longitudinal steps. In one embodiment of the invention, the circumferential phase encoding is achieved through the use of an initial 90 degree RF pulse applied by either the catheter antenna or the body coil means and a series of alternating RF pulses originating from the catheter antenna or body coil means.

The radial phase encoding may be effected by amplitude modulation methods. An initial RF pulse, which is a hard pulse, is provided. As known to those skilled in the art, a "hard pulse" is an RF pulse which is non-adiabatic and non-slice/frequency selective. These pulses commonly have a short duration which may be less than 1 msec.

In another embodiment immediately after the initial hard pulse, a 90 degree RF pulse is applied to transform the amplitude modulation to phase modulation.

Depending upon the source of an RF pulse, the catheter antenna or the body coil means, and the use in the circumferential phase encoding or radial phase encoding portions of the method, the pulses may be adiabatic or non-adiabatic.

The apparatus may have a support member and a catheter antenna and body coil means operatively associated therewith. Magnetic field generating means for generating a main magnetic field on a region of interest are provided. Circumferential phase encoding means are provided for alternately applying to the region of interest RF pulses from said catheter antenna and from the body coil means. Radial phase encoding means applied to the region of interest a first radial RF pulse from the catheter antenna. Computer means for receiving data acquired from said circumferential phase encoding, said radial phase encoding, said longitudinal frequency encoding, and producing cylindrical image data therefrom. The computer means also emit signals to control means for initiating an RF pulse from said catheter antenna or said body coil means and to control means for generating gradient waveforms.

As employed herein, the reference to magnetic resonance analysis embraces both imaging and spectroscopy by producing chemical shift spectra.

It is an object of the present invention to provide a method and apparatus for magnetic resonance analysis employing cylindrical coordinates.

It is a further object of the present invention to provide such a method and apparatus which employs a catheter antenna and facilitates high resolution imaging without requiring the use of high strength gradients.

It is another object of the present invention to provide such a method and apparatus which may be employed with conventional magnetic resonance imaging equipment.

It is a further object of the invention to provide such a system which may be employed in combination with a catheter so as to facilitate imaging or chemical shift spectra within an opening in a patient, such as a blood vessel, and may be used for such purposes as atherosclerotic plaque investigation.

It is a further object of the invention to provide such a system which is adapted for rapid and reliable functioning.

It is another object of the present invention to provide such a system wherein spatially varying voxel sizes provide information.

It is a further object of the present invention to provide such a method and apparatus which may be employed for 2-D or 3-D magnetic resonance imaging in a cylindrical coordinate system.

These and other objects of the invention will be more fully understood from the following description of the invention on reference to the illustrations appended hereto.

DESCRIPTION OF THE PREFERRED EMBODIMENTS

As employed herein, the term "patient" means members of the animal kingdom including human beings.

As used herein, the term "specimen" refers to any object placed in the main magnetic field for imaging and shall expressly include, but not be limited to patients, biological tissue samples, and test specimens removed from such members of the animal kingdom. It shall include inanimate objects which may be imaged by magnetic resonance or which contain water or sources of other sensitive nuclei.

As employed herein, the term "body coils" means any antenna that generates a highly uniform RF magnetic field around the region of interest.

As employed herein, the term "catheter antenna" means any antenna that generates an RF magnetic field that has a phase profile circumferentially varying phase profile. Preferably, this antenna has uniform phase along the longitudinal and radial directions.

Figure 1:
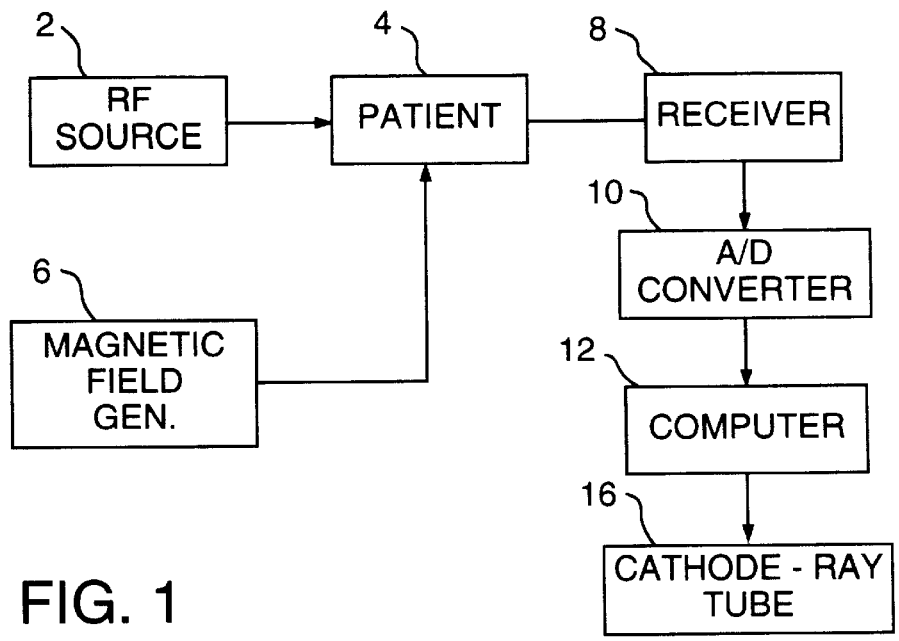
FIG. 1 is a schematic illustration of a magnetic resonance imaging system.

FIG. 1 shows a schematic representation of the general concept of magnetic resonance analysis. An RF source 2 provides pulsed radio frequency (RF) energy to the specimen which, in the form shown, is a patient 4 in the main magnetic field which is created by magnetic field generator 6. The specimen is generally aligned with the main magnetic field and the RF pulses are imposed perpendicular thereto. Where oblique imaging is employed, the angle of impingement of the RF vector representing the spatial gradient in the magnetic field will be angularly offset from cylindrical coordinates. This arrangement results in excitation of the nuclei within the region of interest, which is the area or volume to be imaged, and causes responsive emission of magnetic energy which is picked up by receiver 8.

The receiver 8 may be a catheter antenna which has a voltage induced in it as a result of such responsive emissions of magnetic energy. The signal emerging from receiver 8 passes through analog-to-digital (A/D) converter 10 and enters computer 12. Within the computer 12 the Fourier Transformations of signals convert the plot of amplitude versus time to a map of the distribution of frequencies by plotting amplitude versus frequency. The Fourier Transformations are performed in order to establish the intensity values and locations of specific pixels. These values may be stored, enhanced or otherwise processed and emerge to be displayed on a suitable screen, such as a cathode-ray tube 16, for example.

Figure 2:
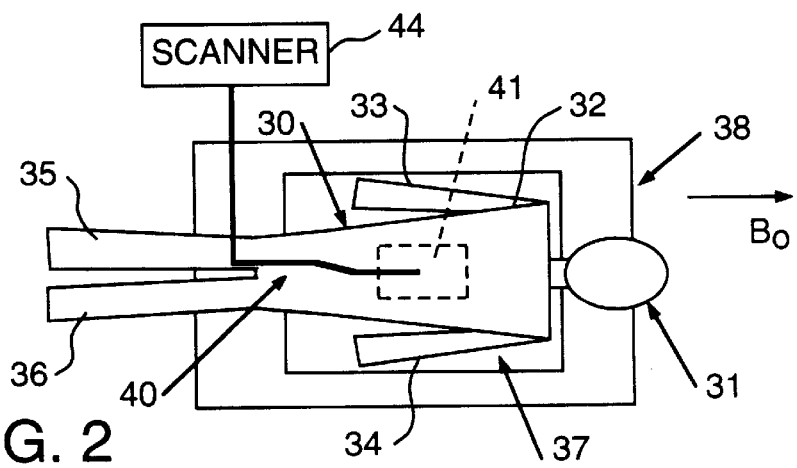
FIG. 2 is a schematic illustration of a catheter and loopless catheter antenna associated with the body coil and magnet of the present invention.

As shown in FIG. 2, specimen 30, which in this case is a human being, has a head 31, a trunk 32, arms 33, 34, and legs 35, 36. The specimen 30 is disposed adjacent to a body coil 37 within the main magnetic field generated by magnet 38. The magnet 38 may be any magnet suitable for use in a magnetic resonance imaging scanner, such as a permanent magnet, a superconductor or a resistive magnet, for example. A catheter antenna 40 which may be loopless catheter antenna has been introduced into the patient 30 in a conventional manner through the femoral artery and into the trunk 32 with the antenna being adjacent to the region of interest 41. The loopless antenna may be of the type disclosed in U.S. patent application Ser. No. 08/638,934, the disclosure of which is expressly incorporated herein by reference. The catheter 40 is operatively associated with magnetic resonance scanner 44. In a preferred embodiment, the catheter antenna is aligned with the main magnetic field $B_o$. This is preferred, for example, where a loopless antenna is employed as such an antenna's circumferential phase profile depends on the orientation. The invention also may be employed with encoding methods which will function for oblique orientation and will employ antennas having minimum dependence on phase to orientation.

Figure 3:
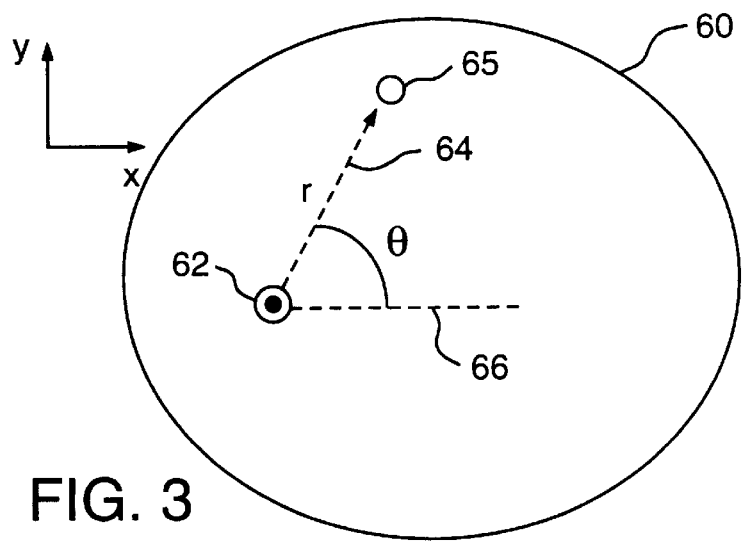
FIG. 3 is a schematic illustration showing the cylindrical coordinates of the present invention.

Referring to FIG. 3, the cylindrical coordinates will be considered. The body coil 60 is adapted to be in surrounding relationship with respect to the longitudinal axis of the catheter 62 which is the z axis. Considering r being a radial extent 64 and θ being the angle from the x axis, the z axis will be going out of the page. The region of interest 65 is also shown.

Figure 4A:
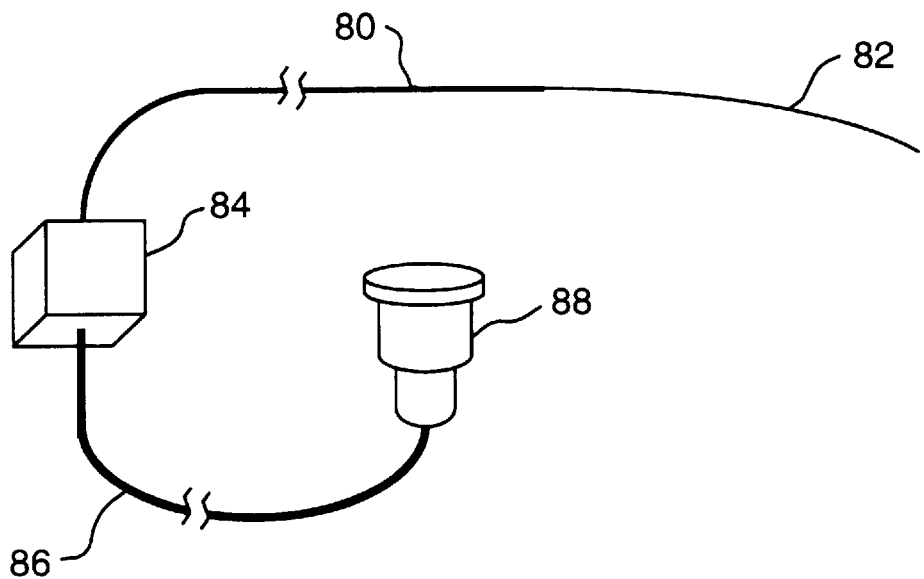
FIG. 4a is a partially schematic illustration of a catheter of the present invention.

As shown in FIG. 4a, a catheter body 80 has a generally centrally disposed electrically conductive portion 82 which is the catheter antenna projecting therefrom. A tuning/matching and decoupling circuit 84 is provided within coaxial cable 86 and connector 88 is adapted to connect the catheter to the control and processing means (not shown).

Figure 4B:
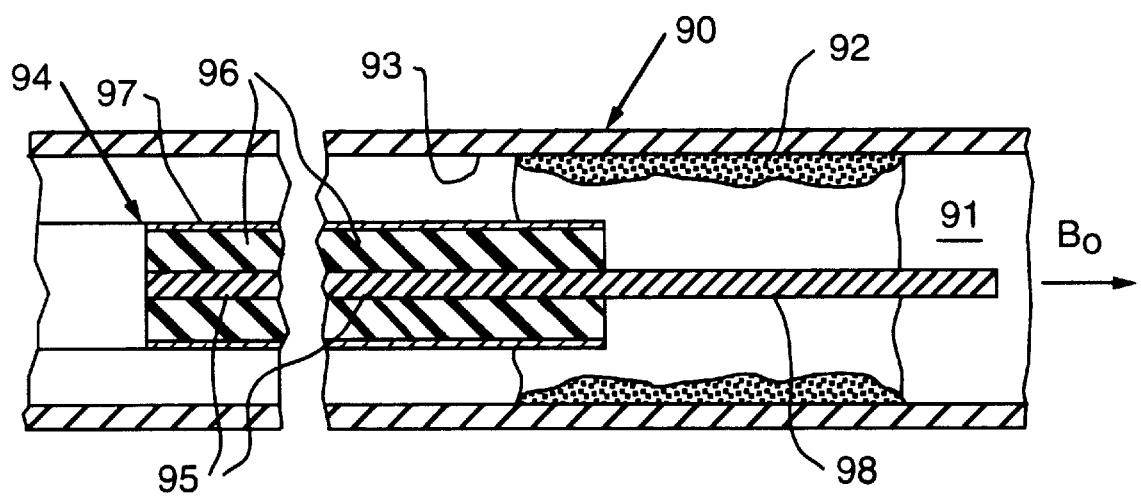
FIG. 4b is a fragmentary cross-sectional illustration of a portion of a patient's blood vessel with a catheter antenna positioned therein.

As shown in FIG. 4b, a patient's blood vessel 90 has blood (not shown) flowing in passageway 91 and plaque 92 on portions of the interior blood vessel surface 93. The catheter 94 is a coaxial cable in the form shown and has antenna portion 95 projecting forwardly in the direction $B_o$. In the portion of the catheter antenna 94 shown in cross-section, the electrically conductive core 95 has a surrounding annular electrically insulative portion 96 and an outer conductive layer 97. Projecting portion 98 of core 95 is the most sensitive portion of the antenna 94 and is positioned closely adjacent to the region of interest which, in this context, is the placque 92. The placque 92 may be imaged in the manner to be described herein. The readout is along the longitudinal axis of the catheter antenna 95. If desired, the catheter 94 or the projecting antenna portion 98 thereof, or both, may be protectively covered by a thin layer of a resinous plastic material or other material which will not interfere with the functioning of the system.

Figure 5:
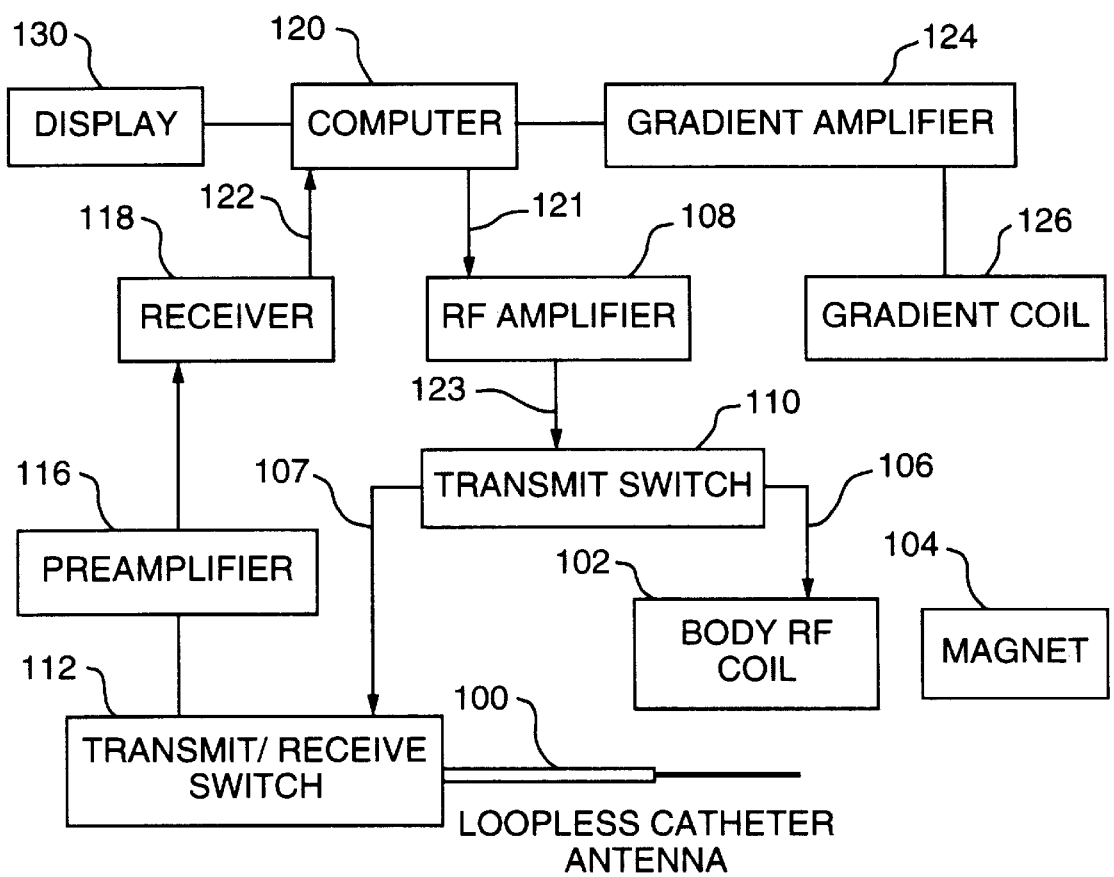
FIG. 5 is a block diagram of an embodiment of the apparatus of the present invention.

With respect to FIG. 5, the loopless catheter antenna 100 has its z axis projecting wire adjacent to the body RF coil 102 and adjacent to the magnet 104 which generates the main magnetic field preferably, but not necessarily in the z direction. The catheter antenna is the z axis for purposes of this diagram. The RF amplifier 108 is interposed between the transmit switch 110 and the body RF coil 102 and the transmit/receive switch 112. The transmit switch 120 responsive to computer 120 establishes the operating mode of the catheter. By the computer 120 controlling the position of the transmit switch 110, it is determined whether the RF pulse will be initiated by the body RF body coil 102 or the catheter antenna 100. The transmit switch 110 is connected to the body RF coil 102 by lead 106 and to the transmit receive switch 112 by lead 107. Regardless of which source of RF pulse is employed, the catheter antenna 100 serves to receive the encoded magnetic resonance signals from the specimen's region of interest. The output of the transmit receive switch 112 passes through preamplifier 116 to receiver 118 wherein the signals containing the acquired data is converted to a responsive, related electrical signals which are delivered to computer 120 over lead 122. The next cycle of operation is controlled by the computer 120 emitting a signal to the RF amplifier 108 over lead 121 which, in turn, emits a responsive signal to the transmit switch over lead 123. The gradient amplifier 124 serves to supply the drive current to the gradient coil 126 in cooperation with computer 120. The gradient coil 126 provides a longitudinal gradient magnetic pulse along the z axis to the region of interest to spatially encode magnetic resonance signals. This is the longitudinal frequency encoding step.

Figure 6:
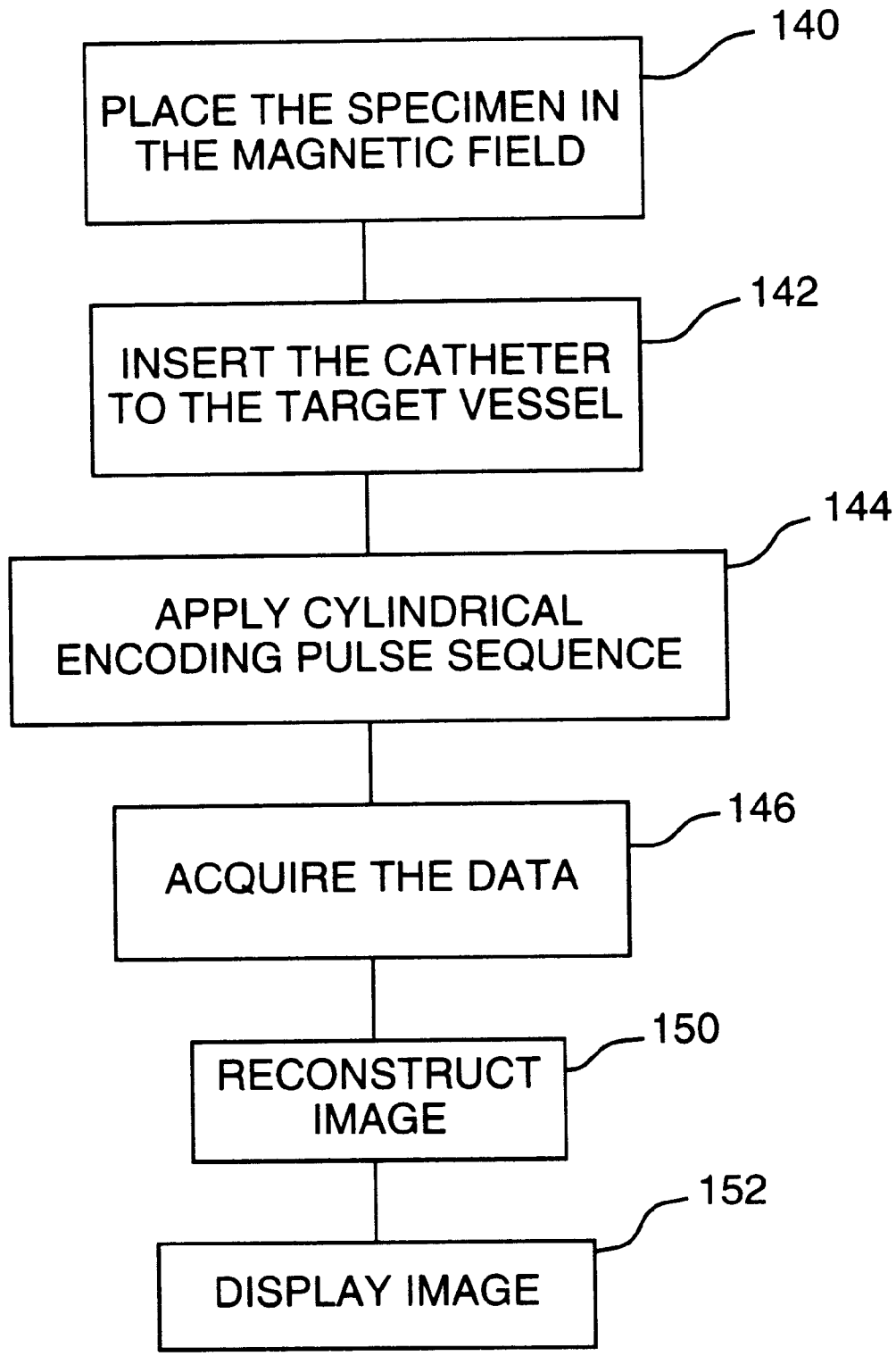
FIG. 6 is a flow diagram showing an embodiment of the method of the present invention.

Referring to FIG. 6, in the process of the present invention, the specimen is placed within the magnetic field generated by the magnet 140. The catheter is inserted into the target blood vessel 142 to the desired position and the cylindrical encoding pulse sequence 144 is applied. The data 146 is acquired by the computer 120. The acquired data 146 is processed in the computer employing inverse FFT in order to produce an image in the cylindrical coordinate system. The inverse FFT could be 1-D, 2-D, 3-D, or 4-D, as desired. The image may be displayed 152.

The image information generated within the computer may be displayed by suitable means 130, such as a CRT, for example, or may be stored or produced in hard copy as desired.

While we do not wish to be bound by their current understanding as to the manner in which the present invention functions, it is presented here as a means of providing added information to those skilled in the art.

To achieve the circumferential Fourier encoding, controlled phase along the circumferential direction is required. In this invention, this is achieved by applying 90 and 180 RF pulses from the catheter antenna and body coil in an alternating fashion. To explain the theory behind this method, it is desirable to show the effect of applying RF pulses from different body coils to the phase.

When the catheter antenna is aligned with the main magnetic field, the phase sensitivity varies in the circumferential direction. The received signal with a catheter antenna is formulated as:

$$s(t) = \int \int \int M(\theta, r, z) \exp(-j\theta) rd\, rd\, \theta d\, z \qquad (1)$$

where M is the transverse magnetization at the time of readout. The letters θ, r, and z represent the cylindrical coordinates. The letter j is the complex number $\sqrt{-1}$. The term $\exp(-j\theta)$ represents the circumferential variation of the phase.

If a perfect 90 degree pulse is applied using a body coil with a phase of φ, the transverse magnetization becomes:

$$M = M_z \exp(j\phi - j\pi) \qquad (2)$$

where $M_z$ is the longitudinal magnetization before the application of the RF pulse. Similarly, if a 90 RF pulse is applied using a catheter antenna, the magnetization becomes:

$$M = M_z \exp(j\phi + j\theta - j\pi) \qquad (3)$$

In this equation, the extra θ term compared to the body coil comes from the fact that the magnetic field produced by the catheter antenna varies circumferentially.

If a 180 RF pulse with a phase of φ is applied using a body coil, the transverse magnetization before the application of the RF pulse becomes its conjugate with an additional phase as follows:

$$M = M^*_{-} \exp(j2\phi) \qquad (4)$$

where $M_{-}$ is the transverse magnetization just before the RF pulse application. "*" represents the complex conjugation operation. If the 180 RF pulse is applied using a catheter antenna, the magnetization becomes:

$$M = M^*_{-} \exp(j2\theta\, j2\phi) \qquad (5)$$

Figure 7:
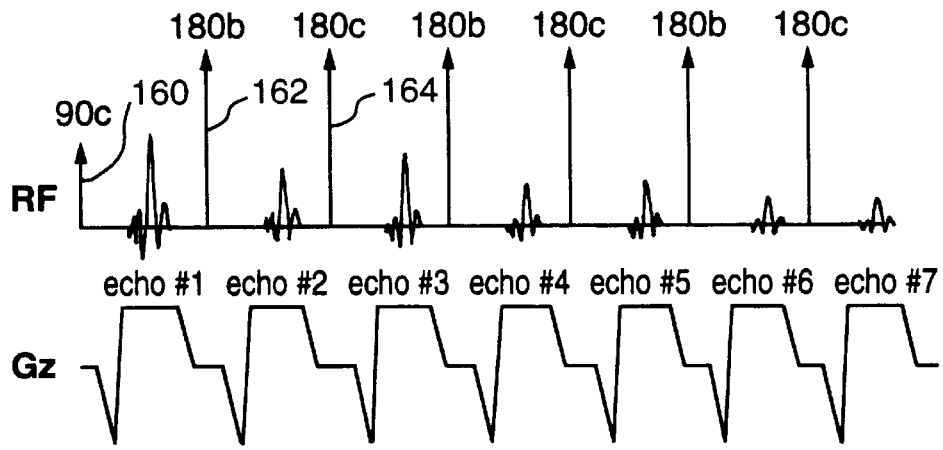
FIG. 7 is a representation of pulses in an even embodiment of circumferential encoding pulses and the related gradient of the present invention.

Using the information above and assuming there are no phase errors and no T2 decay, the transverse magnetization at each echo for the pulse sequence shown in FIG. 7 is calculated as:

$$M_1 = M_z \quad (6)$$

$$M_2 = M_z \exp(j2\theta) \quad (7)$$

$$M_3 = M_z \exp(-j2\theta) \quad (8)$$

$$M_4 = M_z \exp(j4\theta) \quad (9)$$

$$M_5 = M_z \exp(-j4\theta) \quad (10)$$

$$M_n = M_z \begin{array}{l} (\text{if } n \text{ is odd } \exp(-j(n-1)\theta) \\ (\text{if } n \text{ is even } \exp(jn\theta)) \end{array} \quad (11)$$

In FIGS. 7 through 14, the suffix "b" adjacent a number means that the specific RF pulse was applied using the body coil means and the suffix "c" adjacent a number means that the RF pulse was applied by the catheter antenna. The horizontal line adjacent to legend "RF" is a time line with time increasing to the right. The echoes are shown as received on the time line. Underlying the RF pulses is $G_z$, which is the gradient waveform that is employed in generation of a magnetic field gradient along the z direction. This magnetic field gradient controls the echo formation and frequency encodes along the z direction.

"Adiabatic" RF pulses are a special type of RF pulses that produces uniform flip angle even when there is variation in the applied power level. This is especially useful for RF transmission from the surface body coils. See M. Garwood, K. Ugurbil, A. R. Rath, M. R. Bendall, S. L. Mitchell and H. Merkle, "Magnetic Resonance Imaging With Adiabatic Pulses Using a Single Surface Coil for RF Transmission and Signal Detection," *Magnetic Resonance in Medicine*, 9(1):25–34, 1989. All of the 90 degree and 180 degree RF pulses applied using the catheter antenna are adiabatic pulses.

In FIG. 7, the initial RF pulse 160 is a 90 degree RF pulse applied by the catheter antenna. It is followed by a 180 degree RF pulse 162 from the body coil means. The next RF pulse 164 is a 180 degree pulse applied by the catheter antenna. The pulses alternate as to source in this manner. A cycle may have about 1 to 512 RF pulses, for example, and last about 5 msec to 1 sec. The cycle may be repeated every 10 msec to 10 sec. during data acquisition. FIG. 7 illustrates the even $k_\theta$ echoes of circumferential encoding.

Figure 8:
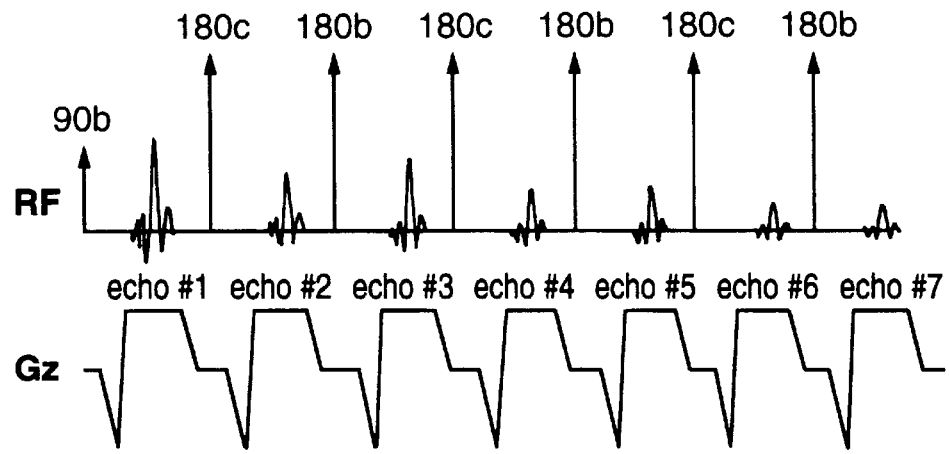
FIG. 8 is a representation of pulses in an odd embodiment of circumferential encoding pulses and the related gradient of the present invention.

FIG. 8 is similar to FIG. 7, except that it shows the odd $k_\theta$ echoes of the circumferential encoding method. The first RF pulse is a body coil 90 degree RF pulse and the first 180 degree pulse is a catheter antenna pulse. For the pulse sequence shown in FIG. 8, the magnetization at each echo can be calculated as:

$$M_1 = M_z \exp(j\theta) \quad (12)$$

$$M_2 = M_z \exp(-j\theta) \quad (13)$$

$$M_3 = M_z \exp(j3\theta) \quad (14)$$

$$M_4 = M_z \exp(-j3\theta) \quad (15)$$

$$M_5 = M_z \exp(j5\theta) \quad (16)$$

with a proper rearrangement of the data, one obtains:

$$M_n = M_z \begin{array}{l} (\text{if } n \text{ is odd } \exp(jn\theta) \\ (\text{if } n \text{ is even } \exp(-j(n-1)\theta) \end{array} \quad (17)$$

If the effect of the readout gradient is added, the following expression is obtained:

$$M_{k_\theta k_z} = \exp(j(k_\theta+1)\theta)\exp(jk_z z) \quad (18)$$

FIG. 7 illustrates the pulse sequence to acquire even number K-space lines which correspond to even values of $K_\theta$ in Equation 19. Substituting the above equation into Equation 1, the following relationship is obtained:

$$s(k_\theta, k_z) = \int \int \int M_z(\theta, r, z)\exp(-jk_\theta\theta)\exp(jk_z z) r d r d \theta d z \quad (19)$$

An inverse 2-D FFT two dimensional Fast Fourier Transformation of the acquired data in the θ and z directions will result in an image in the cylindrical coordinate system with a radial projection.

Figure 9:
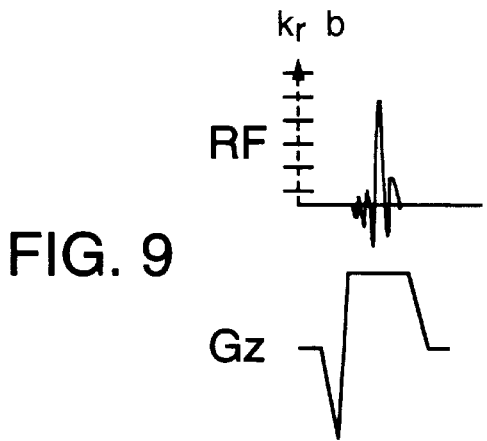
FIG. 9 is a representation of a radial amplitude modulation pulse and echo and the associated gradient.
Figure 10:
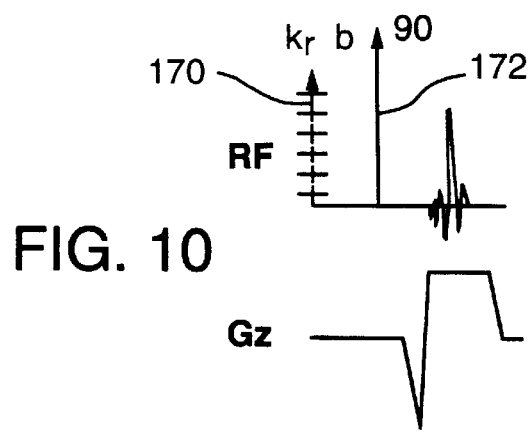
FIG. 10 is a radial phase modulation pulse and subsequent pulse showing the pulses, echo and related gradient.

Radial Fourier encoding is achieved in a similar manner to that of rotational frame zeugmatography. See, D. I. Hoult, "Rotating Frame Zeugmatography," Phllos Trans R. Soc. Land B. Biol. Sci., Vol 289, pp. 543–7 (1980). A hard pulse is applied using the catheter antenna with incremental amplitude which modulates the amplitude of the magnetization along the radial direction (see FIG. 9). A "hard pulse" is a pulse of short duration which may, for example, be on the order of about 10 μsec to 1 msec from which there is no gradient. With radial amplitude modulation, the amplitude of the RF pulses is increased at each phase encoding step. The amount of amplitude increase depends on the desired field of view. The number of cycles employed depends on the desired resolution. The RF pulses are non-adiabatic and are applied by the catheter antenna and have a phase of 90 degrees. Examples of radial RF pulses are shown in FIGS. 9 and 10. Alternatively, a 90 degree RF pulse is applied just after the initial hard pulse to transform the amplitude modulation to the phase modulation (see FIG. 10). The second pulse sequence will be analyzed. The analysis of the former sequence is very similar except the Fourier transformation is replaced with the sine transformation. In the radial phase modulation, the amplitude of the first RF pulse is increased at each phase encoding step. The second RF pulse is an adiabatic pulse. The first RF pulse 170 has a zero phase and the second pulse 172 has a phase of 90 degrees. Both pulses are applied by the catheter antenna.

This method relies on the fact that when an RF pulse is applied using a catheter antenna, the flip angle varies radially with the function of 1/r. For the pulse sequence shown in FIG. 10, the transverse magnetization after each RF pulse can be written as:

$$M_{k_r} = M_z \exp(jk_r \beta/r)\exp(j\theta) \quad (20)$$

where β stands for the incremental amplitude of the RF pulse. By adding the effect of readout gradient to the above equation, the following result is obtained:

$$M_{k_r k_z} = M_z \exp(jk_r \beta/r)\exp(jk_z z)\exp(j\theta) \quad (21)$$

Substituting the above expression into Equation 1, the following relation is obtained:

$$S_{k_r,k_z} = \int \int \int M_z(\theta, r, z) \exp(jk_r \beta / r) \exp(jk_z z) r d r d \theta d z \quad (22)$$

An inverse 2-D FFT of the acquired data over variables $k_r$ and $k_z$ will result in an image in the 1/r-z coordinate system with a circumferential projection:

$$F(z, \beta/r) = -\int M_z(\theta, r) r^3 / \beta d\theta \quad (23)$$

After $1/r^3$ correction and doing $(\beta/r)$ to r transformation, the r-z image is obtained. In this method, the voxel size increases with $r^3$ and the sensitivity of the catheter antenna decreases by 1/r. Overall, the signal to noise ratio of the images increases by $r^2$. A uniform signal to noise ratio image can be obtained using an RF pulse that generates a flip angle inversely proportional to its amplitude.

Figure 11:
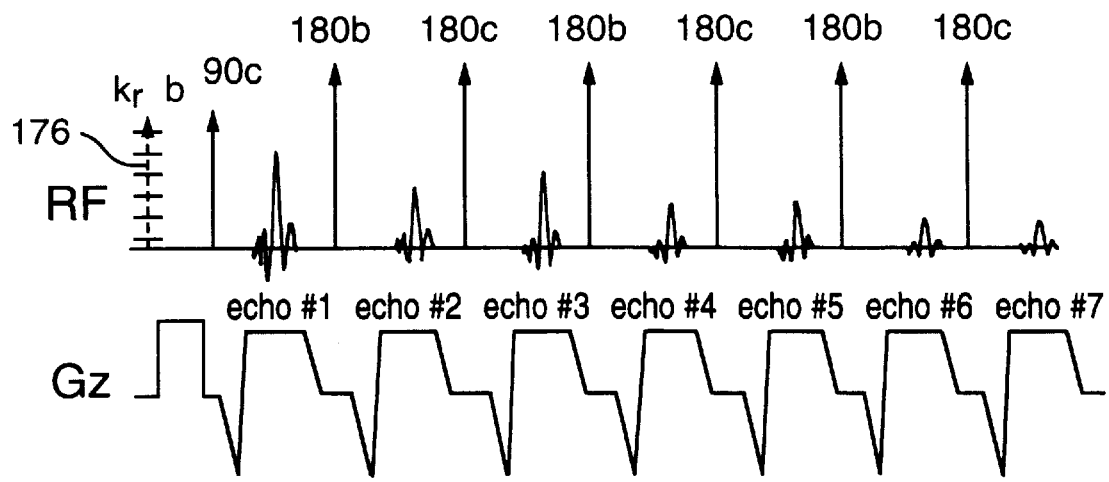
FIG. 11 is an illustration of the pulses, even echoes and related gradient of the 3-D cylindrical encoding.
Figure 12:
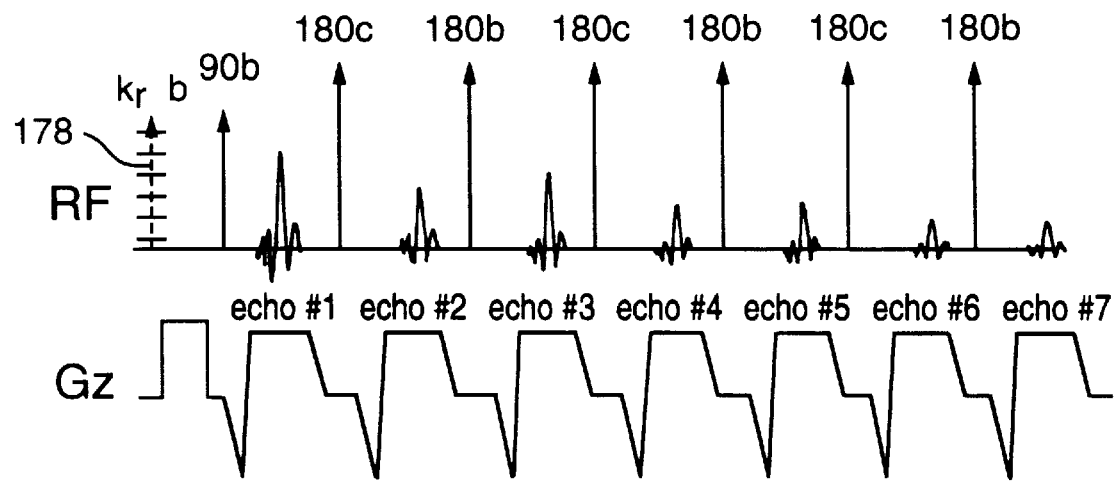
FIG. 12 is an illustration similar to FIG. 11, but showing odd echoes.

By combining the radial and circumferential encoding methods, a 3-D cylindrical encoding pulse sequence is obtained as shown in FIGS. 11 and 12. The first pulse 176 in FIG. 11, which shows even $k_\theta$ echoes of 3-D cylindrical encoding, is a short hard pulse. The first pulse 178 in FIG. 12, which shows odd $k_\theta$ echoes of 3-D cylindrical encoding is also a short hard pulse. Radial encoding is achieved by the spin preparation sequence. A crusher after the excitation from the catheter antenna kills the transverse component of the magnetization. The longitudinal magnetization becomes radially amplitude-modulated. The circumferential encoding is applied after this preparation period. The analysis of the pulse sequence is very similar to previous methods disclosed herein and will be apparent to those skilled in the art from the foregoing disclosure.

Figure 13:
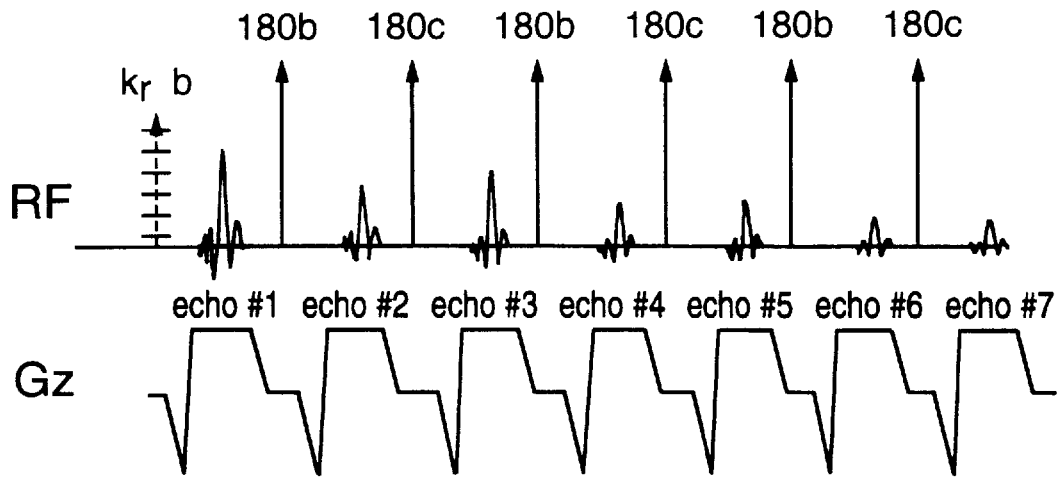
FIG. 13 illustrates the pulses, echoes and associated gradient for 3-D cylindrical even encoding achieved with phase encoding in both circumferential radial directions.
Figure 14:
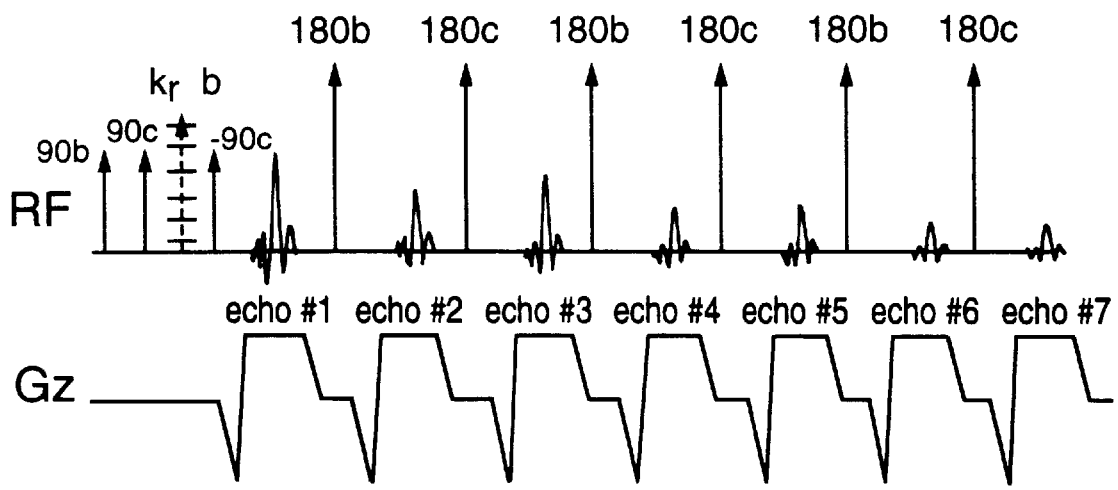
FIG. 14 is similar to FIG. 13, but shows odd echoes.

Another implementation of 3-D cylindrical encoding is given in FIGS. 13 and 14 which respectively show even $k_\theta$ and odd $k_\theta$ echoes of 3-D cylindrical encoding with phase encoding being achieved in both radial and circumferential directions. In this sequence, both circumferential and radial encoding are done using phase modulation. The even echoes are obtained simply by replacing the adiabatic 90 degree RF pulse in FIG. 13 with a hard pulse, the amplitude of which is increased at each radial encoding step (FIG. 13). To obtain odd echoes, however, several RF pulses are employed to achieve the proper encoding. An analysis of the first four RF pulses give the result of additional radial encoding to the odd $k_\theta$ lines.

The present invention provides a unique phase encoding method for 2-D or 3-D magnetic resonance imaging in the cylindrical coordinate system. The method uses gradient magnetic pulses in only the readout or longitudinal direction. Radial and circumferential encoding are done using RF body coils with the information obtained from these encoding steps with the information obtained from the longitudinal phase encoding. In one embodiment, the information obtained from the phase encoding step is combined with only the information obtained from the longitudinal frequency encoding steps.

It will be appreciated that for some uses, such as internal blood vessel imaging, for example, it will be desirable for the catheter antenna to be flexible, not all uses require such flexibility.

It will be appreciated that the present invention may be employed to image stationary or moving objects.

While the present disclosure has focused on the preferred use of the present invention in connection with a catheter, the invention is not so limited. A suitable support member other than a catheter which provides one antenna in combination with another RF source which have non-uniform phase profiles can be employed with the pulse sequences. An example is shown in FIG. 15.

Figure 15:
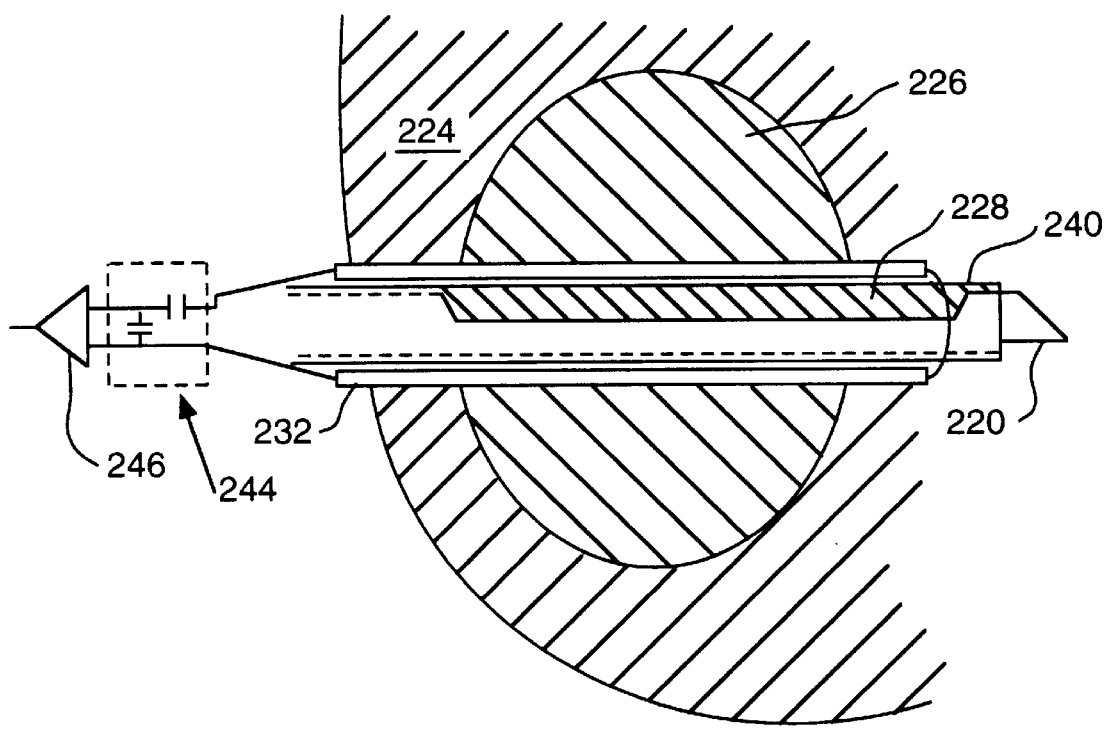
FIG. 15 is a cross-sectional view of a biopsy needle embodiment of the invention.

FIG. 15 is a schematic illustration of an embodiment of the present invention employed with a biopsy needle 220 which is composed of a material which is magnetic resonance compatible, such as a ceramic material as distinguished from a steel material, for example. In this embodiment the specimen 224 contains a lesion 226 from which a sample 228 has been obtained by the biopsy needle 220. In this embodiment, the needle coil 232 serves the function of the antenna in the prior embodiment. The needle coil 232 which is fixedly secured to the exterior of the needle sheath 240 may be a 2 or 4 conductor needle coil having the general configuration in 2 or 4 conductor coil. A tuning and matching circuit 244 is electrically connected to both the needle coil 232 and preamplifier 246 which serves to amplify the signal before it enters the computer (not shown in this view) for further processing. In this embodiment, the needle coil 232 need not be flexible and the apparatus need not enter a natural passageway within the patient. The needle coil 232 may be secured to the needle by a suitable glue or resin or in the case of a ceramic material, by depositing the conductor onto the ceramic by methods well known to those skilled in the art of electronic integrated circuit fabrication. The conductors are then sheathed with insulating material. In the pulse sequences of FIGS. 7–14, the biopsy needle can replace the catheter antenna and produce cylindrically encoded images around the needle. The biopsy needle of the type shown in United States patent application Ser. No. 08/457,833 filed Jun. 1, 1995 may be employed in connection with the present invention. This application is expressly incorporated herein by reference.

Figure 16:
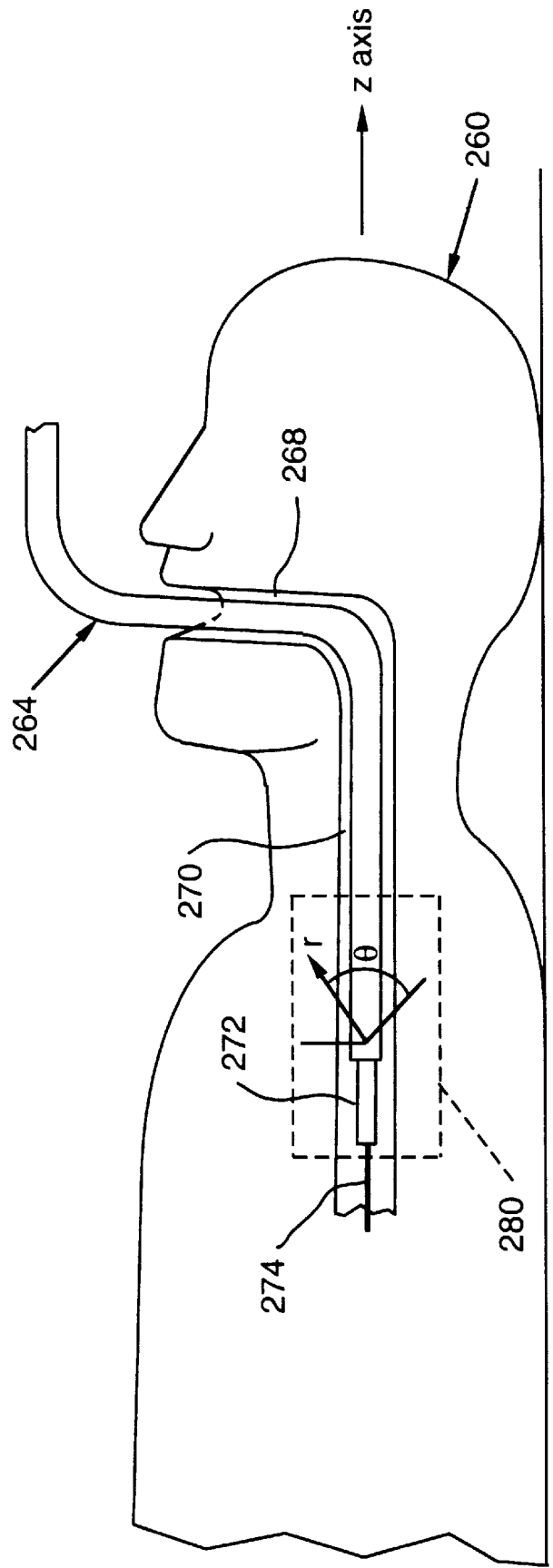
FIG. 16 is a schematic illustration of an endoscope employing the present invention.

Referring to FIG. 16, an embodiment of the invention employed in an endoscope will be considered. A patient 260 has an endoscope 264 inserted through mouth 268 into the esophagus 270. The antenna 272 which may be made of coaxial cable has a sensitive end portion 274 which, in the form shown, projects along the z axis. The region of interest or imaging volume 280 is shown as are the r and θ coordinates. The antenna 272 is delivered to the esophagus by the endoscope 264 which serves as a support surface therefor. In the pulse sequences of FIGS. 7 through 14, the endoscope can replace the catheter antenna and produce cylindrically encoded images around the endoscope.

Figure 17:
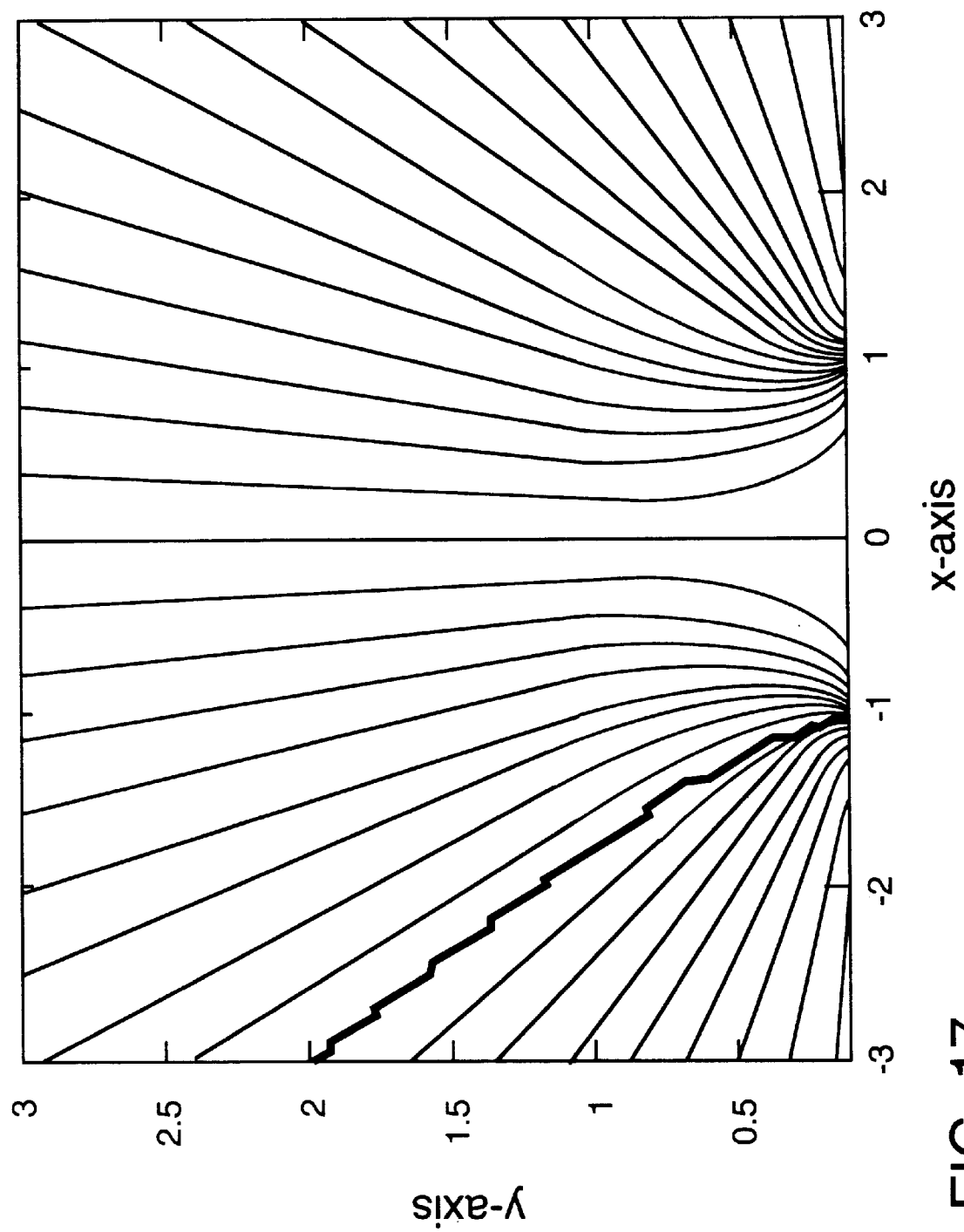
FIG. 17 illustrates a phase map showing the phase sensitivity of a circular surface coil employable in the present invention.

A phase map of circular surface body coil's phase sensitivity as used in another embodiment of the invention which does not employ the catheter antenna is shown in FIG. 17. The radius of the coil is 1 unit and contour lines are separated by 10 degrees. The x axis and y axis represent spatial coordinates with respect to the coil. In FIG. 17 a 1 unit surface coil is placed at the origin with the axis of the coil being the y axis.

When the circular surface body coil is used, the two-dimensional Fourier transform of the data will result in spectra of the voxels shown, separated by the contour lines in FIG. 17.

Figure 18:
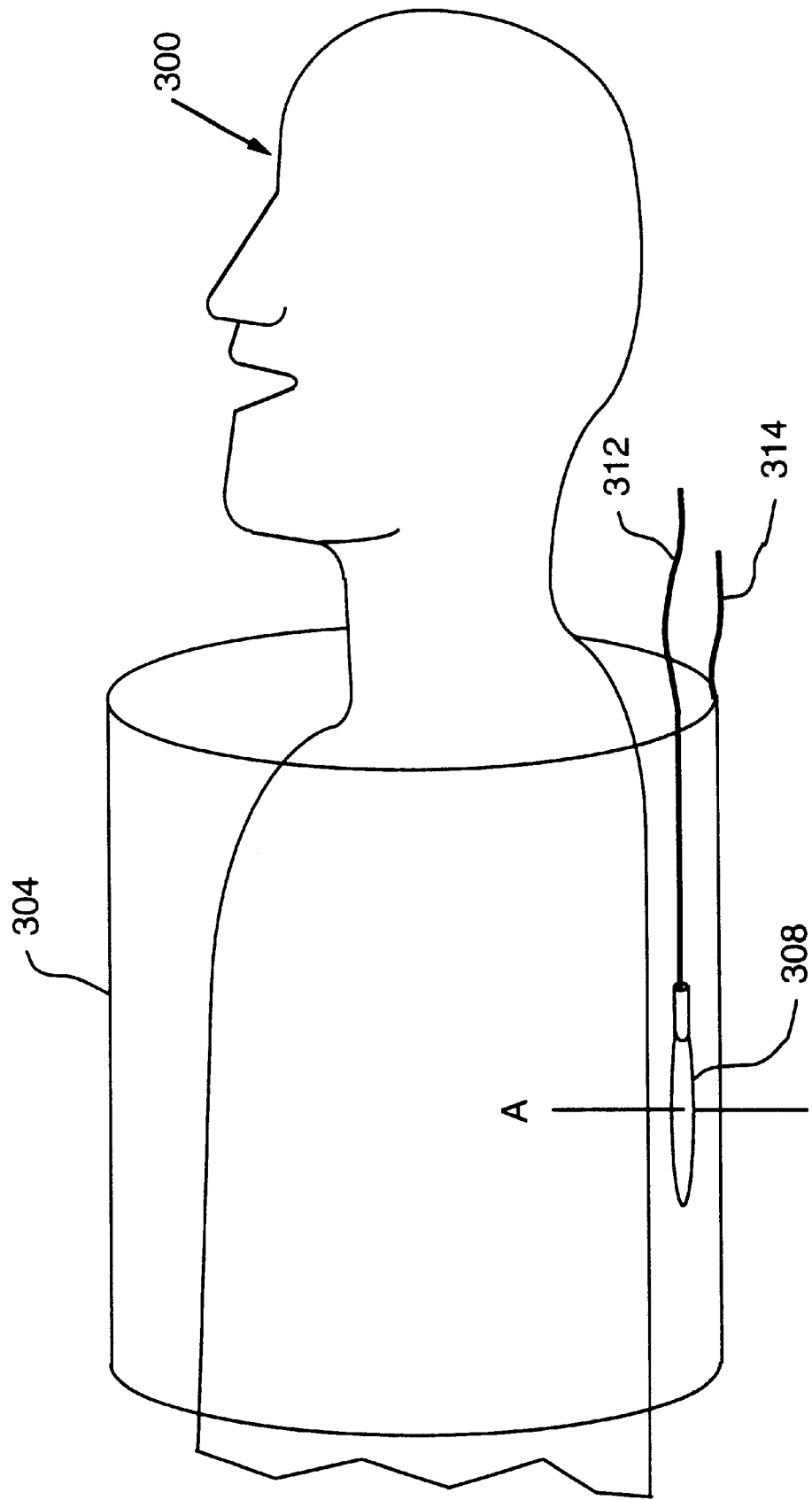
FIG. 18 is a schematic illustration of a patient positioned partially within apparatus of the present invention which employs a surface coil.

The method of achieving the circumferential encoding may be identical to the one described herein in connection with cylindrical encoding using a catheter antenna with the surface coil replacing the catheter antenna. As shown in FIG. 18, a patient 300 is coaxial with the body coil 304. The axis A of the circular surface coil 308 will not be coaxial with the body coil and preferably will be perpendicular thereto, although other angular positions may be employed. A fast spin echo-like pulse sequence is applied by alternating the source of the transmitter from the surface body coil to the body coil as shown in the pulse sequences shown in FIGS. 7 through 14. In this embodiment, the RF pulses that are applied by the catheter antenna and the body coil in the other embodiment are applied by the surface coil. With reference to FIG. 5, the surface coil 308 is electrically connected to the scanner's transmit/receive switch 312 and the body coil 304 is electrically connected to switch 110.

The present invention may be employed in spectroscopy to determine and display chemical shift spectra by minor variation in the RF pulses in a manner well known to those skilled in the art.

Someone skilled in the art may convert the consequences shown in the FIGS. 7 through 14, for example, by removing the readout gradient waveforms to magnetic resonance spectroscopic imaging techniques. As will be known to those skilled in the art, spectroscopic imaging may be achieved by employing other gradients such as crusher gradients, for example, or no gradients. In this way, one can obtain high resolution spectroscopic images of a specimen without requiring high strength gradient waveforms.

It will be appreciated that the present invention provides an efficient method and apparatus for magnetic resonance imaging employing cylindrical coordinates. The invention may be employed advantageously for catheter antenna imaging, as well as other embodiments. Alternating two sources of the RF pulse generation is employed.

Whereas particular embodiments of the invention have been described herein for purposes of illustration, it will be evident to those skilled in the art that numerous variations of the details may be made without departing from the invention as defined in the appended claims.

We claim:

1. A method of magnetic resonance analysis of a specimen employing cylindrical coordinates comprising
    providing a support member having an RF pulse transmitting catheter antenna and RF pulse transmitting body coil means operatively associated therewith,
    imposing a main magnetic field on a region of interest of said specimen,
    effecting circumferential phase encoding by applying to said region of interest an initial RF pulse from said catheter antenna or said body coil means and subsequently applying an initial series of RF pulses alternating between said catheter antenna and said body coil means as the source of said pulses,
    employing receiver means to receive magnetic energy received from said specimen responsive to said RF signals and emitting responsive magnetic resonance signals to processing means, and
    creating in said processing means a cylindrical coordinate image or chemical shift spectra of said region of interest by using information obtained during said circumferential phase encoding step.

2. The magnetic resonance imaging method of claim 1 including
    employing said method in magnetic resonance imaging, and
    applying longitudinal gradient magnetic pulses to said region of interest to spatially encode magnetic resonance signal.

3. The magnetic resonance imaging method of claim 2 including
    effecting radial phase encoding by applying to said region of interest a first radial RF pulse from said antenna, and
    combining in said processing means information obtained from said radial phase encoding step with said information obtained from said circumferential phase encoding step and said longitudinal encoding step.

4. The magnetic resonance imaging method of claim 2 including
    employing an elongated catheter as said support member.

5. The magnetic resonance imaging method of claim 2 including
    employing as said initial RF pulse a 90 degree pulse and employing as said subsequently applied series 180 degree pulses.

6. The magnetic resonance imaging method of claim 4 including
    employing as said initial pulse an RF pulse from said catheter antenna.

7. The magnetic resonance imaging method of claim 4 including
    employing an RF pulse from said body coil means as said initial pulse.

8. The magnetic resonance imaging method of claim 3 including
    after said first radial RF pulse applying a second RF pulse by either said catheter antenna or said body coil means.

9. The magnetic resonance imaging method of claim 4 including
    employing said method while said elongated catheter is disposed in an opening in a patient's body.

10. The magnetic resonance imaging method of claim 4 including
    employing said method when said elongated catheter is disposed in a patient's blood vessel.

11. The magnetic resonance imaging method of claim 10 including
    employing said method in gathering information regarding atherosclerotic plaque.

12. The magnetic resonance imaging method of claim 2 including
    applying 90 degree and 180 degree pulses of said initial series of RF pulses by said catheter antenna as adiabatic pulses.

13. The magnetic resonance imaging method of claim 2 including
    applying as said initial RF series of pulses about 1 to 512 RF pulses of 180 degrees.

14. The magnetic resonance imaging method of claim 2 including
    after said initial series of RF pulses repeating said initial RF pulse and said initial series of RF pulses.

15. The magnetic resonance imaging method of claim 2 including
    employing an inverse 2-D FFT of the data acquired in the θ and z directions in said circumferential phase encoding step to create an image in the cylindrical coordinate system with a radial projection.

16. The magnetic resonance imaging method of claim 3 including
    employing an inverse 3-D FFT of the data acquired in the θ, r and z directions in said circumferential phase encoding step to create an image in the cylindrical coordinate system with a radial projection.

17. The magnetic resonance imaging method of claim 3 including
    applying said first radial RF pulse in said radial phase encoding as a non-adiabatic pulse.

18. The magnetic resonance imaging method of claim 17 including applying said first RF pulse with a phase of 90 degree.

19. The magnetic resonance imaging method of claim 3 including modulating by said first radial RF pulse the amplitude of the magnetization along the radial direction by increasing the amplitude of said first radial RF pulse at successive phase encoding steps.

20. The magnetic resonance imaging method of claim 3 including applying by said catheter antenna a second radial RF pulse after said first radial RF pulse during said radial phase encoding to transform the amplitude modulation to phase modulation, and employing a 90 degree RF pulse as said second radial RF pulse.

21. The magnetic resonance imaging method of claim 20 including employing an adiabatic pulse as said second radial RF pulse.

22. The magnetic resonance imaging method of claim 2 including employing phase encoding in both said circumferential phase encoding and said radial phase encoding steps.

23. The magnetic resonance imaging method of claim 4 including effecting readout of said longitudinal frequency encoding step along the longitudinal axis of the cylindrical coordinates.

24. The magnetic resonance imaging method of claim 20 including applying said second radial RF pulses by said catheter antenna means.

25. The magnetic resonance imaging method of claim 2 including employing as said catheter antenna a loopless catheter antenna.

26. The magnetic resonance imaging method of claim 2 including said support member being a biopsy needle.

27. The magnetic resonance imaging method of claim 2 including employing gradients solely in the z direction.

28. The magnetic resonance imaging method of claim 1 including employing an endoscope as said support member.

29. The magnetic resonance imaging method of claim 28 including employing said method to create said chemical shift spectra, and employing a gradient other than a readout gradient in said method.

30. The magnetic resonance imaging method of claim 1 including employing a circular surface coil as said RF pulse transmitting antenna.

31. The magnetic resonance imaging method of claim 30 including positioning said circular surface coil with its axis not coaxial with the axis of said coil means.

32. Apparatus for magnetic resonance of a specimen employing cylindrical coordinates comprising a support member, a catheter antenna operatively associated with said support member, body coil means operatively associated with said support member, magnetic field generating means for generating a main magnetic field in a region of interest of said specimen, circumferential phase encoding means for alternately applying to said region of interest RF pulses from said catheter antenna and from said body coil means, computer means for receiving data acquired from said circumferential phase encoding and producing a cylindrical coordinate image or chemical shift spectra therefrom, receiver means for receiving magnetic energy from said specimen responsive to said RF signals and emitting responsive signals to said computer means.

33. The magnetic resonance analysis apparatus of claim 32 including said apparatus being imaging apparatus, and gradient generating means for establishing a longitudinal gradient in said region of interest.

34. The magnetic resonance imaging apparatus of claim 33 including radial phase encoding means for applying a first radial RF pulse from said antenna, and said computer means having means for combining data from said radial phase encoding step with data from said circumferential phase encoding.

35. The magnetic resonance imaging apparatus of claim 33 including said support member being an elongated catheter.

36. The magnetic resonance imaging apparatus of claim 33 including display means for receiving cylindrical coordinate image data from said computer means and displaying the same.

37. The magnetic resonance imaging apparatus of claim 33 including said control means having means for alternately providing RF pulses from said body coil means and said catheter antenna means.

38. The magnetic resonance imaging apparatus of claim 33 including said circumferential phase encoding means having means for applying an initial RF pulse from said catheter antenna or said body coil means and subsequently applying an initial series of RF pulses alternating between said catheter antenna and said body coil means as the source of said pulses.

39. The magnetic resonance imaging apparatus of claim 34 including said radial phase encoding means having means for applying a first radial RF pulse from said catheter antenna.

40. The magnetic resonance imaging apparatus of claim 38 including said computer means having means for employing an inverse 2-D FFT of the acquired data in the $\theta$ and z directions to create said cylindrical coordinate image data.

41. The magnetic resonance imaging apparatus of claim 38 including said computer means having means for employing an inverse 3-D FFT of the acquired data in the $\theta$, r and z directions to create said cylindrical coordinate image data.

42. The magnetic resonance imaging apparatus of claim 32 including said support member being a biopsy needle.

43. The magnetic resonance imaging apparatus of claim 33 including said catheter antenna being a loopless catheter antenna.

44. The magnetic resonance imaging apparatus of claim 33 including said circumferential phase encoding means including means for applying said catheter antenna RF pulses as adiabatic pulses.

45. The magnetic resonance imaging apparatus of claim 32 including said support member being structured to be introduced into a patient.

46. The magnetic resonance imaging apparatus of claim 32 including said support member being an endoscope.

47. The magnetic resonance imaging apparatus of claim 32 including said support member being a catheter structured to be introduced into a patient's blood vessel.

48. The magnetic resonance imaging apparatus of claim 32 including said support member being an endoscope.

49. The magnetic resonance imaging apparatus of claim 32 including said antenna being a circular surface coil.

50. The magnetic resonance imaging apparatus of claim 32 including said antenna having a non-uniform phase profile from said body coil means.

51. The magnetic resonance imaging apparatus of claim 33 including said gradient generating means having means for generating a gradient other than said longitudinal gradient.

52. The magnetic resonance imaging apparatus of claim 51 including said gradient being a crusher gradient.

* * * * *

UNITED STATES PATENT AND TRADEMARK OFFICE
CERTIFICATE OF CORRECTION

PATENT NO.   : 6,031,375
DATED        : February 29, 2000
INVENTOR(S)  : Ergin Atalar and Ogan Ocali It is certified that error appears in the above-identified patent and that said Letters Patent is hereby corrected as shown below:

<u>Title page, item [22]</u>
Please change filing date from November 26, 1996 to November 26, 1997

Please change Attorney, Agent, or Firm from Greenberg Traurig; Mark A. Wurm to Foley, Hoag & Eliot LLP; Matthew P. Vincent Signed and Sealed this Ninth Day of October, 2001

*Attest:*

NICHOLAS P. GODICI
*Attesting Officer* — Acting Director of the United States Patent and Trademark Office

UNITED STATES PATENT AND TRADEMARK OFFICE
CERTIFICATE OF CORRECTION

PATENT NO.    : 6,031,375
DATED         : February 29, 2000
INVENTOR(S)   : Ergin Atalar et al.

It is certified that error appears in the above-identified patent and that said Letters Patent is hereby corrected as shown below:

Column 14,
Line 16, after the words "computer means", insert the following:

-- , and
control means responsive to said computer means for initiating an RF pulse from said catheter antenna or said body coil means --

Signed and Sealed this

Eighth Day of April, 2003

JAMES E. ROGAN
*Director of the United States Patent and Trademark Office*